United States Patent
Rooney et al.

(10) Patent No.: US 8,659,961 B2
(45) Date of Patent: *Feb. 25, 2014

(54) MEMORY REPAIR SYSTEMS AND METHODS FOR A MEMORY HAVING REDUNDANT MEMORY

(75) Inventors: Randall Rooney, Boise, ID (US); Steve Zerza, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/619,363

(22) Filed: Sep. 14, 2012

(65) Prior Publication Data

US 2013/0010557 A1 Jan. 10, 2013

Related U.S. Application Data

(63) Continuation of application No. 12/779,597, filed on May 13, 2010, now Pat. No. 8,289,790.

(51) Int. Cl.
*G11C 7/00* (2006.01)

(52) U.S. Cl.
USPC .................. 365/200; 365/225.7; 365/230.08

(58) Field of Classification Search
USPC ................................. 365/200, 225.7, 230.08
See application file for complete search history.

(56) References Cited

U.S. PATENT DOCUMENTS

| | | | |
|---|---|---|---|
| 6,072,737 A | 6/2000 | Morgan et al. | |
| 6,240,535 B1 | 5/2001 | Farnworth et al. | |
| 6,324,105 B1 | 11/2001 | Shirley | |
| 6,618,304 B2 | 9/2003 | Duesman | |
| 7,310,278 B2 * | 12/2007 | Bright et al. | 365/200 |
| 7,401,270 B2 | 7/2008 | Hummler | |
| 7,721,163 B2 * | 5/2010 | Fujiwara et al. | 714/710 |
| 7,885,128 B2 | 2/2011 | Fujiwara | |
| 8,289,790 B2 * | 10/2012 | Rooney et al. | 365/200 |

* cited by examiner

*Primary Examiner* — Son Dinh
*Assistant Examiner* — Nam Nguyen
(74) *Attorney, Agent, or Firm* — Dorsey & Whitney LLP

(57) ABSTRACT

Memories, memory repair logic, and methods for repairing a memory having redundant memory are disclosed. One such memory includes programmable elements associated with respective redundant memory configured to have memory addresses mapped thereto, the programmable elements configured to be programmed with at least portions of the memory addresses. Such a memory further includes repair logic coupled to the programmable elements and configured to identify programmable elements available for programming to map memory addresses to respective redundant memory. One method for remapping a memory address of a memory to redundant memory includes receiving at least a portion of a memory address to be remapped to redundant memory, determining whether a programmable element associated with the redundant memory is available for programming, and when a programmable element is available, programming the programmable element such that the memory address will be mapped to the associated redundant memory.

24 Claims, 5 Drawing Sheets

MEMORY REPAIR SYSTEMS AND METHODS FOR A MEMORY HAVING REDUNDANT MEMORY

CROSS-REFERENCE TO RELATED APPLICATION

This application is a continuation of U.S. patent application Ser. No. 12/779,597, filed May 13, 2010, U.S. Pat. No. 8,289,790 on Oct. 16, 2012. This application and patent are incorporated by reference herein in their entirety and for all purposes.

TECHNICAL FIELD

Embodiments of the present invention relate generally to memory having redundant memory, and more specifically, in one or more of the illustrated embodiments, to mapping a memory address provided to memory for repair to redundant memory.

BACKGROUND OF THE INVENTION

Memory include redundant memory in order to "repair" memory locations deemed to be defective (e.g., failing). As used herein, the phrase "defective memory location" is used to refer to a memory location deemed to be defective, regardless of whether it actually is defective. Typically, memory addresses corresponding to defective memory locations are mapped to redundant memory so that when the defective memory locations are to be accessed (e.g., read or write data), the redundant memory to which the memory addresses are mapped are actually accessed instead. Programmable elements, such as fuse banks comprised of individual programmable elements (e.g., fuses, antifuses, flash cells, phase change cells, and the like) and associated redundant memory are used to program the memory addresses so that when access to a programmed memory address is requested, access is made to the associated (e.g., corresponding) redundant memory instead of the defective memory locations.

One example of repairing defective memory locations is through the use of a memory tester. The memory tester tests a memory under test to determine if there are any defective memory locations by writing data to the memory, and reading back the data from the memory. The data read is compared to the data that was written to determine if the memory accurately stored the written data. Memory locations that return read data different than the write data are deemed defective and the corresponding memory addresses are stored. After identifying the defective memory locations of the memory, the memory tester analyzes the memory addresses for the defective memory locations and resolves a redundancy solution to map the memory addresses of the defective memory locations to redundant memory. If there is insufficient redundant memory to repair all of the defective memory locations, the memory cannot be repaired.

Another example of repairing defective memory locations is through the use of self-testing and repair. Circuitry is included in the memory device to perform memory testing to determine defective memory locations and effect repair by remapping the memory addresses of the defective memory locations to redundant memory. The process of memory testing and repair is performed internally by the memory.

Memory testing and repair is typically performed by the manufacturer before the memory is provided to customers. In some cases, however, a customer may subject the memory to further assembly that may affect performance of the memory, including basic memory functionality. As a result, the memory is tested again after the customer's assembly process is completed by using a memory tester. The memory tester, however, typically does not include an analysis engine for resolving a redundancy solution to repair any defective memory locations identified by the memory testing. Moreover, calculating a solution often requires proprietary information that is available only to the manufacturer. Without the ability to repair defective memory locations of a memory already assembled by the customer, the memory must be disassembled and replaced, or the entire assembly discarded. Both solutions, however, are very undesirable because of the likelihood of damaging the assembly during the memory removal and replacement process as well as wastage of parts if the entire assembly is discarded.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
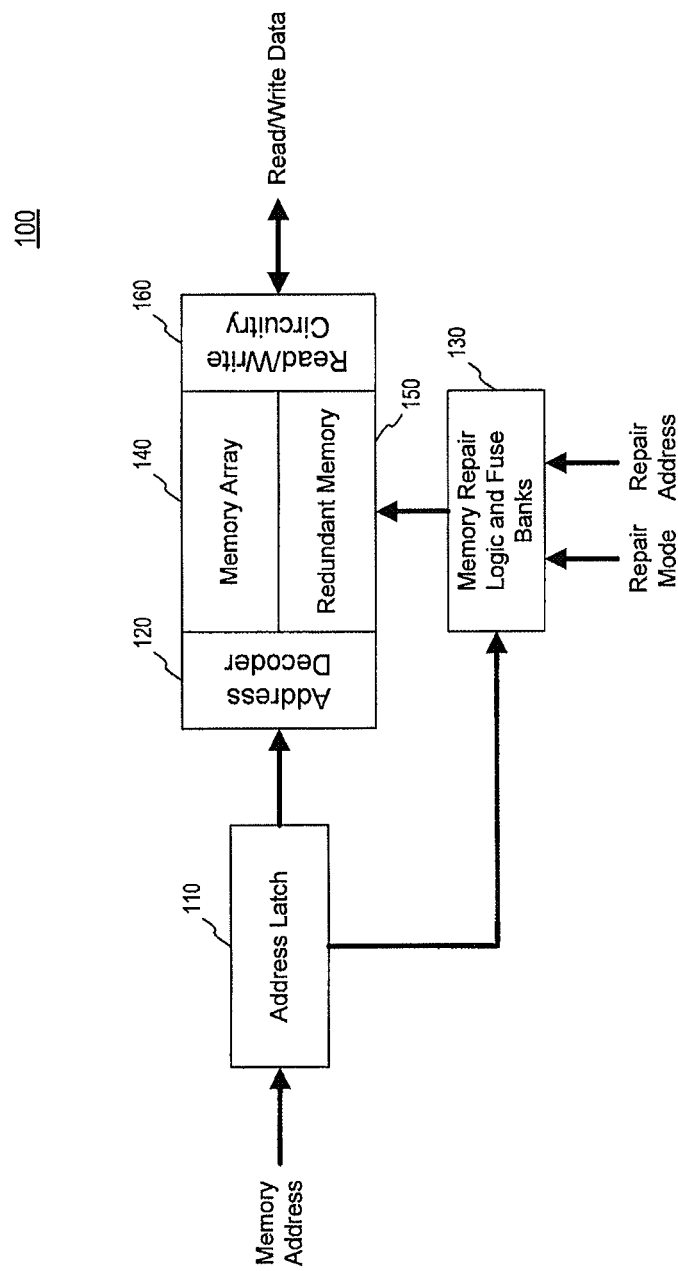
FIG. 1 is a block diagram of a portion of a memory according to an embodiment of the invention.

FIG. 1 illustrates a portion of a memory 100 according to an embodiment of the invention. An address latch 110 receives a memory address and stores (e.g., latches) the address. The latched address is provided to an address decoder 120 which decodes the latched address and provides internal address signals to access the memory locations in the memory array 140 corresponding to the latched address. Read/write circuitry 160 is coupled to the memory of the memory array 140 to provide read data from the memory array 140 or to provide write data to the memory array 140 for storage.

The memory array 140 includes redundant memory 150 that may be used to repair defective memory locations in the memory array by mapping the memory address of the defective memory locations to redundant memory. In some embodiments, the redundant memory 150 includes redundant rows of memory to which rows of memory of the memory array may be mapped and further includes redundant columns of memory to which columns of memory of the memory array may be mapped. In some embodiments, the memory array 140 is divided into sub-arrays (e.g., banks or planes) and the redundant memory 150 is divided into portions that are limited to repair memory in a respective sub-array. As will be explained in more detail below, a unit of redundant memory typically has an associated programmable element(s) (e.g., a fuse bank) that may be programmed to map a memory address to the associated redundant memory.

At least a portion of the memory address latched by the address latch is also provided to memory repair logic and fuse banks 130. For example, a memory address may include row, column, and bank addresses. The row, column, bank address, or some combination of the addresses, may be provided to the memory repair logic and fuse banks 130. The term "memory address" is intended to be broadly interpreted and may refer to, for example, a memory address provided to the memory, portions of a memory address provided to the memory, internal address signals generated based at least in part from a memory address or a portion of a memory address, or other indicators identifying memory locations and/or portions of memory in the memory array. The memory addresses of defective memory locations are programmed in the fuse banks so that when the memory array 140 is accessed, the latched memory address is compared to the programmed memory addresses in the fuse banks to determine if the latched memory address corresponds to a memory location mapped to redundant memory 150 (i.e., repaired by redundant memory). In the event the latched memory address matches one of the programmed memory addresses, the redundant memory corresponding to the fuse bank having the programmed memory address is accessed instead of the defective memory location. The memory repair logic and fuse banks 130, which will be explained in greater detail below, also enables the memory 100 to repair defective memory locations identified by a memory address provided to the memory repair logic and fuse banks 130 by an external memory tester. In this manner, memory locations may be repaired using remaining redundant memory after the memory has been manufactured, for example, by a purchaser of the memory that has identified memory addresses of defective memory locations.

Figure 2:
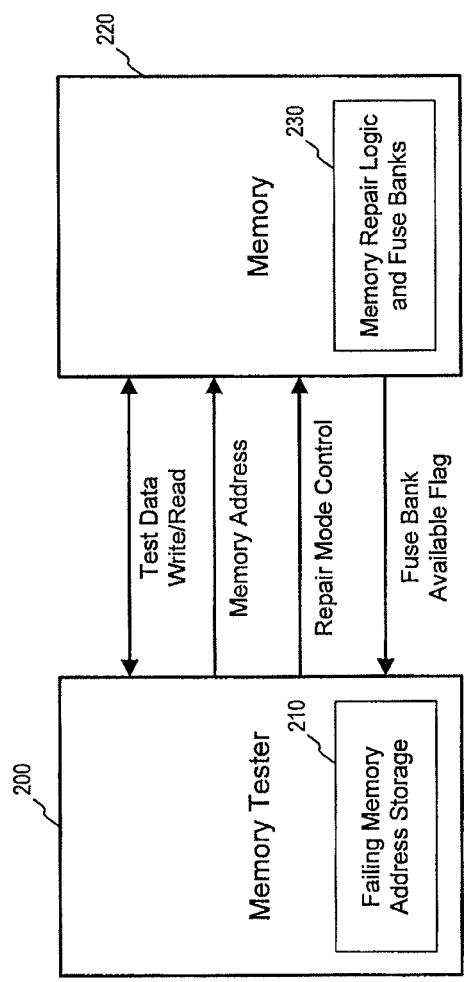
FIG. 2 is a block diagram of a tester and memory under test according to an embodiment of the invention.

FIG. 2 illustrates a memory tester 200 coupled to a memory 220 according to an embodiment of the invention. The memory 220 may include the portions of memory 100 illustrated in and described with reference to FIG. 1, for example, memory repair logic and fuse banks 130, shown in FIG. 2 as memory repair logic and fuse banks 230. The memory tester 200 includes a defective memory address storage 210 for storing the memory addresses of memory locations that are determined to be defective during testing of the memory 220. That is, the memory tester 200 writes test data to memory locations of the memory 220 and determines if any of the memory locations are defective by reading back the test data from the memory 220 and comparing the read data from a memory location with the write data written to that memory location.

Figure 3:
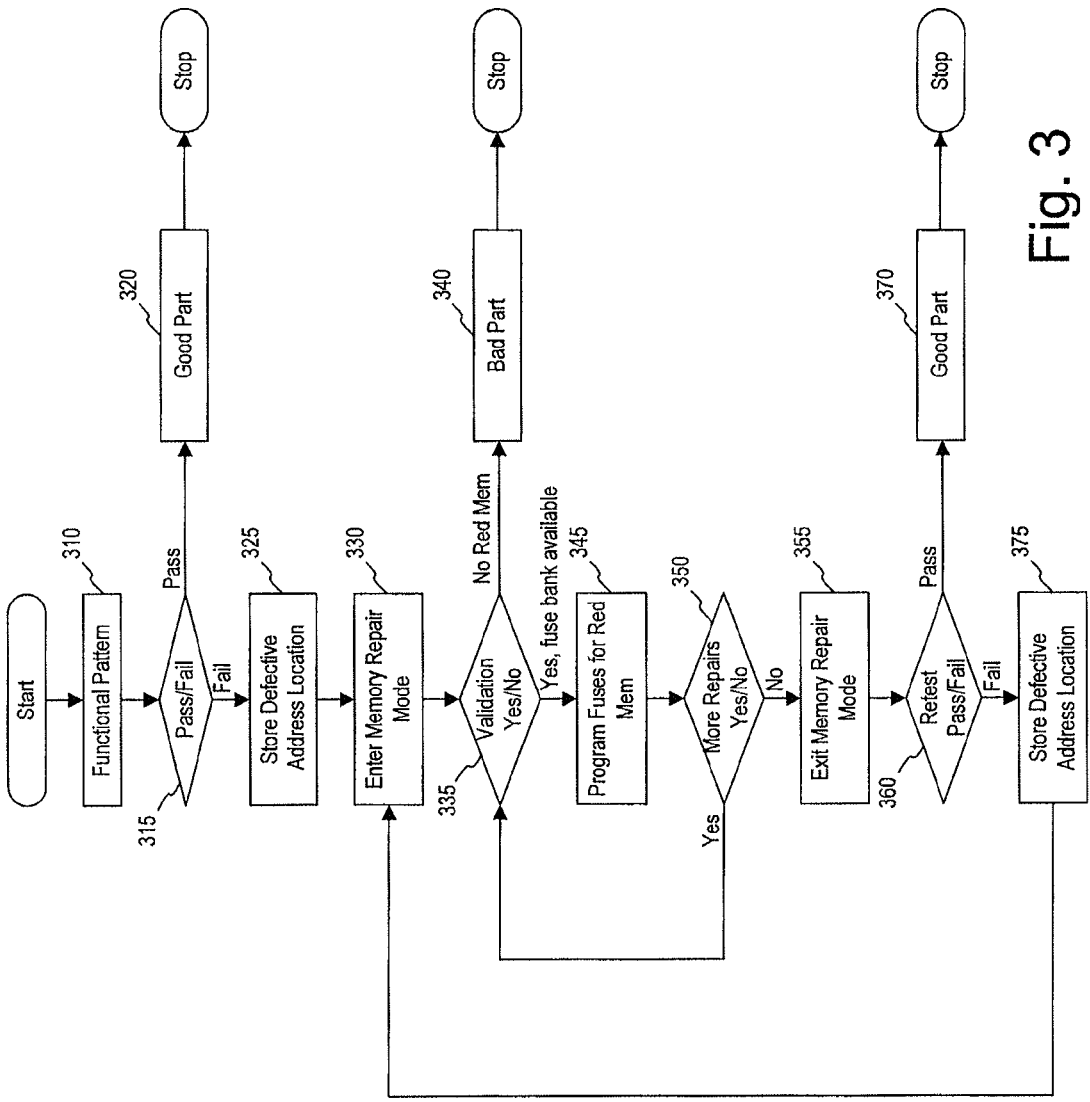
FIG. 3 is a flow diagram for memory repair according to an embodiment of the invention.

FIG. 3 illustrates a memory test and repair procedure according to an embodiment of the invention. The memory test and repair procedure illustrated in FIG. 4 may be used with the memory tester 200 and memory 220 illustrated in and described with reference to FIG. 2. A memory under test is tested at step 310 by writing functional test patterns of data to memory locations in the memory under test and reading the data from the memory under test. The read data is compared with the respective write data for the memory locations to determine if any of the memory locations are defective. For example, if the read data from a memory location is not the same as the data originally written to that memory location, the memory location may be determined "defective". At step 315, if none of the memory locations of the memory under test are defective (i.e., pass) then the memory under test is deemed a good part at step 320. However, if defective memory locations are identified, the memory addresses for the defective memory locations are stored at step 325.

At step 330 a memory repair mode for the memory under test is entered so that defective memory may be repaired using available redundant memory. At step 335 availability of fuse banks for programming to repair defective memory locations corresponding to a stored memory address is determined (e.g., validated). If during step 335 it is determined that there are no fuse banks available for programming (i.e., there is no redundant memory available to repair the defective memory location corresponding to the stored memory address), the memory under test is deemed to be a defective part at step 340. If however, fuse banks available for programming are identified, programmable elements of the fuse bank, for example, antifuses, are programmed at step 345 so that when access to the defective memory location is requested, the corresponding memory address is mapped to the redundant memory associated with the programmed fuse bank instead of to the defective memory location.

Additional memory addresses may be programmed where additional fuse banks are available. Determining the availability of fuse banks for programming may be performed in various manners without departing from the scope of the present invention. For example, in the embodiment illustrated in FIG. 3, at step 350 if there are more defective memory to repair (i.e., more stored memory addresses), the step at 335 is performed again to determine if there are more fuse banks available for programming, and if so, the fuse bank is programmed to map the stored memory address to the redundant memory associated with the fuse bank. If, however, all defective memory locations are repaired, the memory repair mode is exited at step 355. The memory under test may be tested again at step 360, for example, to test that the programming of any fuse banks at step 345 correctly maps memory addresses of defective memory to redundant memory, to determine if there any other defective memory locations. If it is determined there are no other defective memory locations, the memory under test is deemed to be a good part at step 370. If additional memory locations are found to be defective, however, the memory repair mode can be re-entered at step 330 to repeat the validation and repair process, and the retest of the memory under test of steps 335-375.

Figure 4:
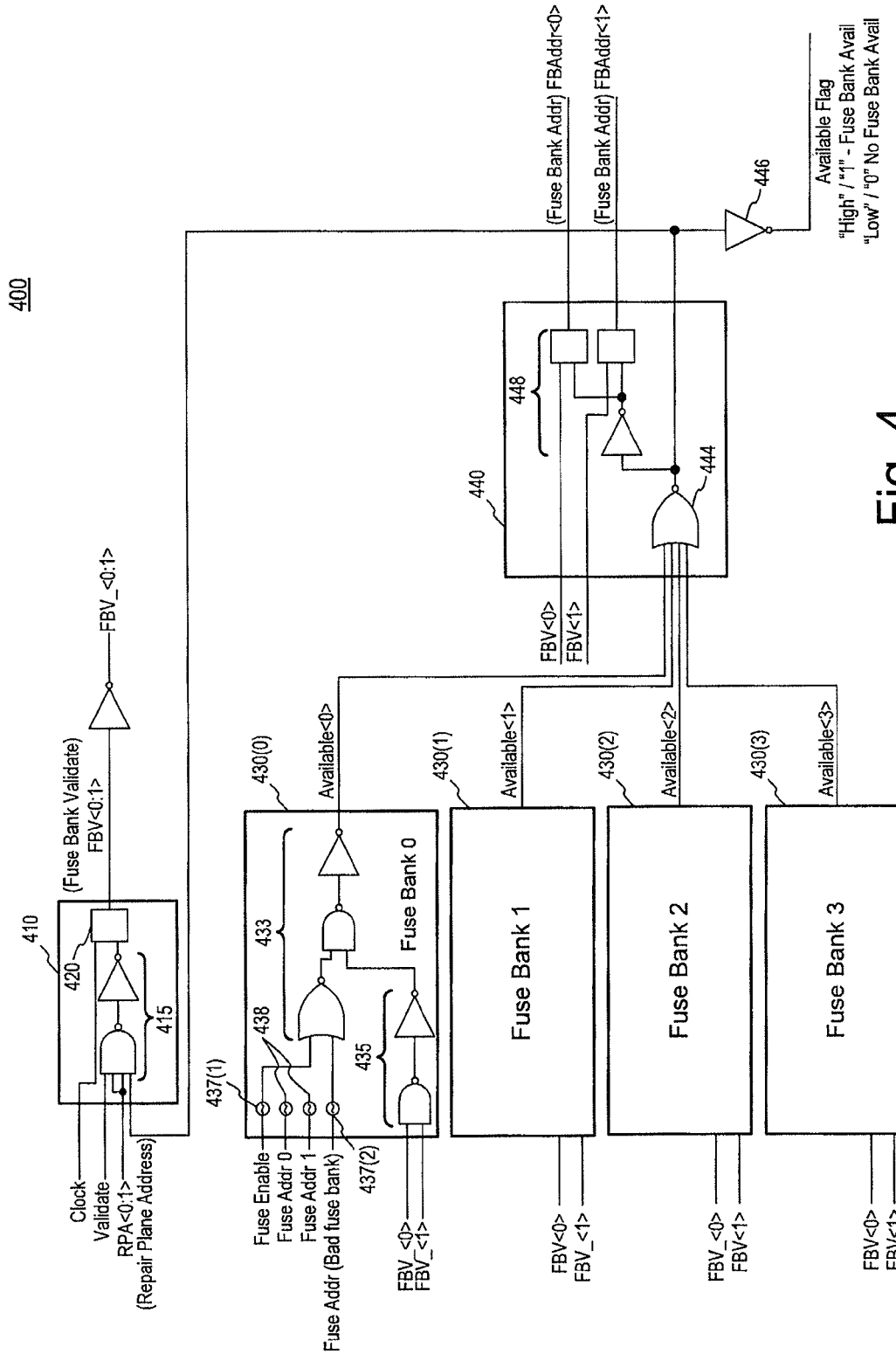
FIG. 4 is a block diagram of memory repair logic and fuse banks according to an embodiment of the invention.

FIG. 4 illustrates memory repair logic and fuse banks 400 according to an embodiment of the invention. The memory repair logic and fuse banks 400 may be used for the memory repair logic and fuse banks 130 and 230 of FIGS. 1 and 2. Fuse bank address logic 410 receives a validate signal that is active when a repair mode is entered to enable a memory to repair defective memory locations. The fuse bank address logic 410 further receives an address value related at least in part on the address or a portion of the address corresponding to a defective memory location to be repaired and an availability signal indicative of whether a fuse bank is available for programming (i.e., redundant memory is available for repair). For example, the address may be a repair plane address (e.g., RPA<0:1>, as shown for the embodiment of FIG. 4) that is based at least in part on the address or a portion of the address for the memory location which identifies a repair plane in which the address for the memory location is located. A clock signal is provided to a fuse bank counter circuit 420 that is enabled through enable logic 415 in response to the validate, address, and availability signals previously discussed. The clock signal clocks the fuse bank counter circuit 420 which provides a sequence of fuse bank addresses that are used to sequence through fuse banks 430. In the embodiment illustrated in FIG. 3, four fuse banks 430(0)-430(3) are shown, and a 2-bit counter circuit 420 is used in the fuse bank address logic 410. In other embodiments, fewer or greater fuse banks 430 are included, and the fuse bank counter circuit 420 provides an appropriate number of fuse bank addresses to sequence through the fuse banks 430.

Fuse bank 430(0) is shown in detail. The fuse banks 430 (1)-430(3) may have the same arrangement as fuse bank 430(0) as described below. Fuse bank 430(0) includes fuse bank address decode logic 435 coupled to receive the fuse bank address provided by the fuse bank counter circuit 420. The bank address decode logic 435 generates a high logic signal in response to the fuse bank address corresponding to the respective fuse bank. The fuse bank 430(0) further includes at least one programmable element 437, for example, an antifuse, that may be used to indicate whether the fuse bank 430(0) is available for programming. For example, programmable element 437(1) indicates that the fuse bank 430(0) has already been programmed to repair another defective memory location, that is, a memory address for a defective memory location is already mapped to the redundant memory associated with the fuse bank. Another example is programmable element 437(2) which can be used to indicate that the redundant memory associated with the fuse bank 430(0) is unavailable because it has been deemed defective and cannot be used to repair a defective memory location. The fuse bank 430(0) further includes programmable elements 438 which may be programmed with an address to be mapped to the redundant memory associated with the fuse bank 430(0). In some embodiments, at least a portion of the address to be mapped is programmed in the fuse bank 430(0), such as, a row address, column address, bank address, other addresses related at least in part on the address to be mapped, or combinations of the addresses.

Fuse bank status logic 433 provides an output signal for the fuse bank 430(0) based on the state of the programmable elements 437 and if a current fuse bank address generated by the fuse bank counter circuit 420 matches (as determined by bank address decode logic 435) the respective fuse bank. For example, if either or both programmable elements 437(1) and 437(2) are programmed, the fuse bank 430(0) will output a low logic signal indicating that the redundant memory associated with fuse bank 430(0) is unavailable for use to repair a defective memory location. If the programmable elements 437(1) and 437(2) are not programmed, the fuse bank 430(0) will output a high logic signal when the fuse bank address provided by the fuse bank counter circuit 420 generates the fuse bank address for fuse bank 430(0), indicating that the fuse bank 430(0) is available for programming.

The output signals from the fuse banks 430 are provided to fuse bank program logic 440. The fuse bank program logic 440 includes fuse bank address latches and enable logic 448. The fuse bank address latches and enable logic 448 enable the fuse bank address latches in the event the fuse bank corresponding to the fuse bank address provided by the fuse bank address logic 410 is available for programming (i.e., to map the memory address for a defective memory location to the redundant memory associated with the fuse bank). However, when the fuse bank address provided by the fuse bank address logic 410 corresponds to a fuse bank that is unavailable for programming (e.g., the fuse bank has already been programmed or the redundant memory associated with the fuse bank is deemed defective), the fuse bank address latches are not enabled, and consequently, that fuse bank address is not latched. When enabled, however, the fuse bank address latches latch the fuse bank address of the available fuse bank and provides the latched fuse bank address to identify which fuse bank can be programmed so that the memory address (e.g., which corresponds to a defective memory location to be repaired) can be mapped to the redundant memory associated with the fuse bank.

The fuse bank program logic 440 further includes fuse bank availability logic 444 coupled to the enable logic 448 to provide a signal that is used to enable the fuse bank address latches, as previously described. The fuse bank availability logic 444 also provides an availability signal to the fuse bank address logic 410, for example, through an inverter 446. The availability signal can be used to prevent the fuse bank counter circuit 420 from continuing to count (i.e., generate a new fuse bank address) when a fuse bank 430 is identified as being available for programming. The availability signal can be further used to provide a signal (e.g., flag) indicative of whether a fuse bank can be programmed to map the memory address corresponding to a defective memory location to the associated redundant memory, that is, whether there is redundant memory available to repair a defective memory location. For example, with reference to the embodiment illustrated by and described with reference to FIG. 4, a flag having a high logic level can be provided when one of the fuse banks 430 can be programmed to repair a defective memory location and a flag having a low logic level can be provided when none of the fuse banks 430 are available for programming. The flag may be provided to a memory tester, where it can be used to cease the repair operation for the memory if no banks are available after all of the respective fuse bank addresses have been sequenced through.

In operation, when a repair mode is entered for a memory including memory repair logic and fuse banks 400, an address value related at least in part on the address or a portion of the address corresponding to a defective memory location to be repaired is provided to the fuse bank address logic 410, and availability of a fuse bank for programming is validated by sequencing through fuse bank addresses and identifying the fuse bank address of a fuse bank available for programming. When such a fuse bank 430 is identified, the programmable elements 438 for that fuse bank can be programmed to map the memory address of the defective memory location to the redundant memory associated with the fuse bank. The validation and programming continue until all of the portions of memory addresses received by the fuse bank address logic 410 are mapped to redundant memory or until no more fuse banks 430 are available for programming. In the latter case, the fuse bank program logic 440 provides a flag indicating that no fuse banks are available (i.e., no more redundant memory are available to repair defective memory locations).

Figure 5:
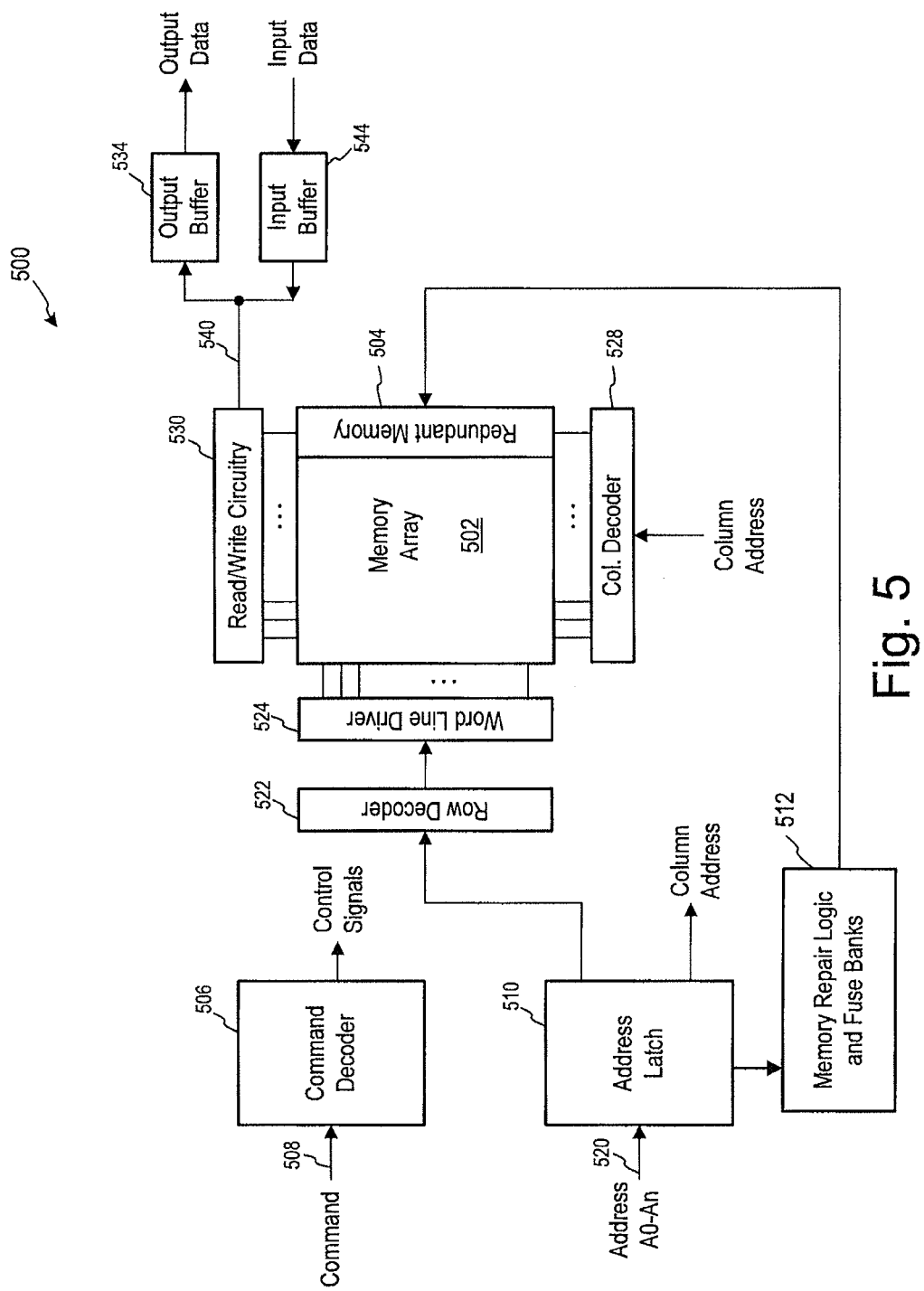
FIG. 5 is a block diagram of a memory having memory repair logic and fuse banks according to an embodiment of the invention.

FIG. 5 illustrates a portion of a memory 500 according to an embodiment of the present invention. The memory 500 includes an array 502 of memory cells, which may be, for example, DRAM memory cells, SRAM memory cells, flash memory cells, or some other types of memory cells. The array 502 includes redundant memory 504 to which memory addresses corresponding to memory locations in array 502 may be mapped. The memory 500 includes a command decoder 506 that receives memory commands through a command bus 508 and generates corresponding control signals within the memory 500 to carry out various memory operations. Row and column address signals are applied to the memory 500 through an address bus 520 and provided to an address latch 510. In some embodiments the address signals may be provided to the address latch 510 in parallel. In other embodiments, the address signals are provided in a multiplexed manner, sequentially, or other manner. The address latch then outputs a separate column address and a separate row address. The address latch 510 further provides the memory address to memory repair logic and fuse banks 512.

Memory repair logic and fuse banks according to an embodiment of the present invention may be used for the memory repair logic and fuse banks 512. The memory repair logic and fuse banks 512 may be used to determine the availability of a fuse bank to be programmed in order to map a memory address to an associated redundant memory.

The row and column addresses are further provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530. The command decoder 506 responds to memory commands applied to the command bus 508 to perform various operations on the memory array 502. In particular, the command decoder 506 is used to generate internal control signals to read data from and write data to the memory array 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory, comprising:
memory repair circuits associated with respective redundant memory, the memory repair circuits configured to have memory addresses mapped thereto, each of the memory repair circuits configured to be programmed with at least a portion of the respective one of the memory addresses, wherein each of the memory repair circuits comprises a fuse bank, wherein a fuse bank comprises:
a plurality of individual programmable elements configured to be collectively programmed with at least a portion of a memory address to be mapped; and
at least one availability programmable element configured to indicate whether the fuse bank is available to be programmed.

2. The memory of claim 1, wherein the at least one availability programmable element comprises a used fuse bank programmable element configured to indicate whether the fuse bank has been programmed to a memory address.

3. The memory of claim 1, wherein the at least one availability programmable element further comprises a defective fuse bank programmable element configured to indicate whether the fuse bank has been determined to be defective.

4. The memory of claim 1, wherein the at least availability programmable element comprises an antifuse.

5. The memory of claim 1, further comprising a flag configured to indicated that no fuse banks are available to program.

6. A memory, comprising:
a fuse bank associated with redundant memory and configured to be mapped to a memory address, the fuse bank comprising:
a plurality of individual programmable elements configured to be collectively programmed with at least a portion of the memory address to be mapped; and
at least one availability programmable element configured to indicate whether the fuse bank is available to be programmed.

7. The memory of claim 6, wherein the at least one availability programmable element comprises a first programmable element configured to indicate whether the fuse bank has been programmed to a memory address.

8. The memory of claim 6, wherein the at least one availability programmable element further comprises a second programmable element configured to indicate whether the fuse bank has been determined to be defective.

9. The memory of claim 1, wherein the fuse bank provides an available signal based on a state of each of the at least one availability programmable elements.

10. A method, comprising:
receiving, from a tester, a memory address to be mapped at a fuse bank associated with redundant memory;
determining whether the fuse bank is available for programming based on a state of at least one programmable element of a plurality of programmable elements of the fuse bank;
programming at least a portion of remaining programmable elements of the plurality of programmable elements of the fuse bank with a value corresponding to the memory address based on the determination of whether the fuse bank is available for programming.

11. The method of claim 10, further comprising programming one of the at least one programmable element responsive to programming of the remaining programmable elements.

12. The method of claim 10, further comprising detecting the state of the at least one programmable element of a plurality of programmable elements of the fuse bank.

13. The method of claim 10, further comprising determining whether the fuse bank has been determined defective based on a state of one of the at least one programmable element of the plurality of programmable elements.

14. The method of claim 13, wherein programming at least the portion of the remaining programmable elements of the plurality of programmable elements of the fuse bank is further based on the determination of whether the fuse bank is defective.

15. The method of claim 13, further comprising programming the one of the at least one programmable element responsive to detecting that the fuse bank is defective.

16. The method of claim 6, wherein programming at least a portion of remaining programmable elements of the plurality of programmable elements of the fuse bank based on the determination of whether the fuse bank is available for programming comprises programming at least a portion of remaining programmable elements of the plurality of programmable elements of the fuse bank with a value corresponding to the memory address when the state of one of the at least one programmable element has a value indicating un-programmed.

17. The method of claim 16, wherein programming at least a portion of remaining programmable elements of the plurality of programmable elements of the fuse bank based on the determination of whether the fuse bank is available for programming further comprises providing an indication that the fuse bank is programmed when the state of one of the at least one programmable element has a value indicating programmed.

18. A method, comprising:
providing, to plurality of a fuse banks associated with redundant memory, a memory address to be mapped;

receiving an availability indication from each of the one or more of the fuse banks, wherein the availability indication indicates whether a corresponding fuse bank is available for programming, the availability indication derived from a programmable element of the corresponding fuse bank; and sending a command to program the memory address in an available fuse bank of the one or more fuse banks based on the availability indication received from each of the fuse banks.

19. The method of claim 18, further comprising detecting an error at a memory location corresponding to the memory address prior to providing the memory address.

20. The method of claim 19, further comprising programming a functional pattern into at a memory location corresponding to the memory address prior to detecting the error.

21. The method of claim 19, wherein sending the command to program the available fuse bank further comprises sending a command to program the programmable element to indicate the available fuse bank is unavailable for programming.

22. The method of claim 19, further comprising:
providing a second memory address to be mapped; and
sending a second command to program the second memory address in a second available fuse bank of the one or more fuse banks based on the availability indication received from each of the fuse banks.

23. The method of claim 19, wherein the availability indication indicates that the corresponding fuse bank is programmed or defective.

24. The method of claim 19, further comprising testing the memory address programmed in the available fuse bank after sending the command to program the memory address in the available fuse bank.

* * * * *

UNITED STATES PATENT AND TRADEMARK OFFICE
CERTIFICATE OF CORRECTION

PATENT NO. : 8,659,961 B2
APPLICATION NO. : 13/619363
DATED : February 25, 2014
INVENTOR(S) : Randall Rooney et al.

It is certified that error appears in the above-identified patent and that said Letters Patent is hereby corrected as shown below:

In the Claims:

In column 7, line 59, in Claim 5, delete "indicated" and insert -- indicate --, therefor.

Signed and Sealed this
Twenty-ninth Day of July, 2014

Michelle K. Lee
*Deputy Director of the United States Patent and Trademark Office*